(12) United States Patent
Bohlländer

(10) Patent No.: US 11,539,305 B2
(45) Date of Patent: Dec. 27, 2022

(54) MODULAR ARRANGEMENT OF A CONVERTER AND AIRCRAFT HAVING A MODULAR ARRANGEMENT

(71) Applicant: Rolls-Royce Deutschland Ltd & Co KG, Blankenfelde-Mahlow (DE)

(72) Inventor: Marco Bohlländer, Hirschaid (DE)

(73) Assignee: Rolls-Royce Deutschland Ltd & Co KG, Blankenfelde-Mahlow (DE)

( * ) Notice: Subject to any disclaimer, the term of this patent is extended or adjusted under 35 U.S.C. 154(b) by 278 days.

(21) Appl. No.: 16/962,626

(22) PCT Filed: Jan. 23, 2019

(86) PCT No.: PCT/EP2019/051653
§ 371 (c)(1),
(2) Date: Jul. 16, 2020

(87) PCT Pub. No.: WO2019/145370
PCT Pub. Date: Aug. 1, 2019

(65) Prior Publication Data
US 2020/0343824 A1 Oct. 29, 2020

(30) Foreign Application Priority Data
Jan. 26, 2018 (DE) .......................... 102018201206.7

(51) Int. Cl.
*H02M 7/00* (2006.01)
*H02P 27/08* (2006.01)
(Continued)

(52) U.S. Cl.
CPC ............ *H02M 7/003* (2013.01); *B64D 27/24* (2013.01); *B64D 29/00* (2013.01); *B64D 33/08* (2013.01);
(Continued)

(58) Field of Classification Search
CPC ... H02M 7/003; B64D 29/00; B64D 2221/00; H02P 27/08
See application file for complete search history.

(56) References Cited

U.S. PATENT DOCUMENTS 8,488,333 B2 * 7/2013 Lapassat .............. H02M 7/003
361/810
2004/0090130 A1 5/2004 Kaneko et al.
(Continued)

FOREIGN PATENT DOCUMENTS

| CN | 106471724 A | 3/2017 |
|---|---|---|
| DE | 19826229 A1 | 2/1999 |

(Continued)

OTHER PUBLICATIONS

Chinese Office Action for Chinese Application No. 201980009998.2 dated Jun. 15, 2021, with English translation.
(Continued)

*Primary Examiner* — Kawing Chan
(74) *Attorney, Agent, or Firm* — Lempia Summerfield Katz LLC

(57) ABSTRACT

The disclosure relates to a modular arrangement of a converter for the electrical supply of a multi-phase electric motor. The modular arrangement includes multiple output stage modules, each module having a separate first housing. An output stage module is provided for each phase of the electric motor, wherein the output stage module has a phase intermediate circuit and an inverter circuit, together forming a commutation cell. The phase intermediate circuit supplies DC voltage and is electrically connected to the inverter circuit. The disclosure also relates to a motor arrangement and an aircraft having a motor arrangement of this type.

14 Claims, 10 Drawing Sheets

(51) Int. Cl.
  *B64D 27/24* (2006.01)
  *B64D 29/00* (2006.01)
  *B64D 33/08* (2006.01)
  *H02M 7/5387* (2007.01)
  *H05K 7/14* (2006.01)
  *H02K 11/33* (2016.01)
  *H02K 5/18* (2006.01)

(52) U.S. Cl.
  CPC ........ *H02M 7/53871* (2013.01); *H02P 27/08* (2013.01); *H05K 7/14* (2013.01); *B64D 2221/00* (2013.01); *H02K 5/18* (2013.01); *H02K 11/33* (2016.01)

(56) References Cited

U.S. PATENT DOCUMENTS

| | | | |
|---|---|---|---|
| 2010/0208446 A1 | 8/2010 | Lapassat | |
| 2017/0338201 A1* | 11/2017 | Shimakawa | ...... H01L 23/49575 |
| 2019/0363072 A1* | 11/2019 | Sano | ...................... H05K 7/209 |

FOREIGN PATENT DOCUMENTS

| | | |
|---|---|---|
| DE | 19859930 A1 | 6/2000 |
| DE | 202008000736 U1 | 3/2008 |
| DE | 102013208976 A1 | 12/2014 |
| DE | 102015206627 A1 | 1/2016 |
| DE | 102015207187 A1 | 10/2016 |
| DE | 102015214053 A1 | 1/2017 |
| DE | 102015218622 A1 | 3/2017 |
| EP | 1418660 A1 | 5/2004 |
| EP | 2048767 A2 | 4/2009 |
| WO | WO2016101997 A1 | 6/2016 |
| WO | WO2017207283 A1 | 12/2017 |

OTHER PUBLICATIONS

German Search Report for German Application No. 10 2018 201 206.7 dated Jan. 14, 2019.

International Search Report and the Written Opinion for International Patent Application PCT/EP2019/051653 dated Apr. 25, 2019.

* cited by examiner

MODULAR ARRANGEMENT OF A CONVERTER AND AIRCRAFT HAVING A MODULAR ARRANGEMENT

The present patent document is a § 371 nationalization of PCT Application Serial No. PCT/EP2019/051653, filed Jan. 23, 2019, designating the United States, which is hereby incorporated by reference, and this patent document also claims the benefit of German Patent Application No. 10 2018 201 206.7, filed Jan. 26, 2018, which is also hereby incorporated by reference.

TECHNICAL FIELD

The disclosure relates to a modular arrangement of a converter for electrically supplying a multiphase electric motor. The disclosure also relates to an aircraft having a modular arrangement as disclosed herein.

BACKGROUND

A power converter which uses an AC voltage or DC voltage to produce an AC voltage, the frequency and amplitude of which are changed, is referred to as a converter, (also called an inverter). Converters may be in the form of AC/DC-DC/AC converters or DC/AC converters, wherein an output AC voltage is produced from an input AC voltage or an input DC voltage via a DC voltage intermediate circuit and clocked semiconductors.

FIG. 1 illustrates a block diagram of an exemplary AC/DC-DC/AC converter 1, in which a three-phase input voltage $U_1$ is formed into a three-phase output voltage $U_2$ in order to drive an electric motor 2. The converter 1 has a rectifier circuit 3, an intermediate circuit 4, and an inverter circuit 5. The rectifier circuit 3, the intermediate circuit 4, and the inverter circuit 5 are controlled by a control circuit unit 6. The published German patent application DE 10 2015 206 627 A1 discloses such a converter 1.

FIG. 2 shows a block diagram of a conventional DC/AC converter 1 having a casing 7 or a structural frame in which the components are accommodated. The important structural power-electronic components include the power semiconductor switches 8, the intermediate circuit 4, and the control logic circuit 9. The power semiconductor switches 8 have a low inductance and are therefore connected spatially very close to the intermediate circuit 4. There is one intermediate circuit 4 for each converter 1, which intermediate circuit may in turn include a plurality of connected capacitors in order to meet all voltage and current-carrying requirements which cannot be met by the individual capacitors per se.

The individual components of converters 1 may be inside a casing 7 which hermetically delimits the environment. Applications in electrically driven aircraft demand a high degree of failure safety of the converters 1.

In a parallel, post-published patent application with the same filing date, it is proposed to separate a converter output stage into phase-selective commutation cells with phase intermediate circuits. The phase intermediate circuits may be optionally combined by a collective intermediate circuit. The separated individual components may be advantageously constructed as structural individual elements and may be connected to one another.

The intermediate circuit is segmented into a plurality of individual intermediate circuits which are separated from one another (and are therefore electrically decoupled with respect to the functionality of an individual large intermediate circuit capacitor). Each phase of the electric motor receives its "own" intermediate circuit. A collective intermediate circuit may parallelize the individual phase intermediate circuits, with the result that there is only "one" intermediate circuit with a high-voltage connection coming from the high-voltage battery, as previously. Depending on the requirement, it is also possible to dispense with the collective intermediate circuit.

SUMMARY

The object of the disclosure is to specify a solution for converters and their operation, which solution provides a high degree of failure safety with a low weight.

According to the disclosure, the stated object is achieved with the modular arrangement and the aircraft disclosed herein.

According to the disclosure, the following results from the separation of the intermediate circuit in converters. The individual phases are structural individual modules (e.g., output stage modules) with their own casing which may be arranged radially, inter alia. For all individual phase modules (e.g., output stage modules), there is a control unit (e.g., control logic module) which is likewise accommodated in an additional casing and may be situated inside the outer ring formed by the radially arranged individual phases.

A modular arrangement of a converter for electrically supplying a multiphase electric motor is provided. The modular arrangement includes: a plurality of output stage modules each having a separate first casing, wherein an output stage module is present for each phase of the electric motor, wherein the output stage module has a phase intermediate circuit and an inverter circuit which together form a commutation cell, and wherein the phase intermediate circuit is supplied with DC voltage and is electrically connected to the inverter circuit.

The disclosure provides the advantage that, as a result of the modular arrangement, it is possible to provide a converter having a high degree of failure safety with an optimized weight.

In one development, the output stage modules may be arranged on the lateral surface of an imaginary cylinder. As a result, the arrangement may be configured to the outer shape of an electric motor.

In a further configuration, the end faces of the output stage modules may be in a common plane and may be uniformly distributed on the lateral surface. As a result, connection to the individual phases of an electric motor is easily possible.

In one development, the output stage module may have a cooling unit, (e.g., with cooling ribs), on an outer side of the first casing. As a result, optimum cooling of the module is possible.

In a further configuration, the arrangement has a collective intermediate circuit module having a second casing, wherein the phase intermediate circuit modules are electrically connected in parallel to the collective intermediate circuit module.

In one development, the collective intermediate circuit module may be annular. As a result, the module may be configured to the shape of an electric motor.

In one development, the internal diameter of the annular collective intermediate circuit module may be equal to the diameter of the imaginary cylinder.

In a further configuration, the arrangement may have a control logic module. The control logic module has a third casing and is configured and programmed to control the inverter circuit, wherein the control logic module is electrically, optically, or electro-optically connected to the output stage modules.

In a further embodiment, the control logic module may be cylindrical, and the output stage modules may be arranged on the outer side of the control logic module.

In one development, the control logic module may have a cutout in the axial direction, through which a forward flow and a return flow of a cooling system of an electric motor may be guided.

The disclosure also provides an arrangement having a cylindrical electric motor, on the end side of which the output stage modules and the control logic module are arranged, and wherein the collective intermediate circuit module is arranged on those sides of the output stage modules which are remote from the electric motor.

In a further configuration, the cylinder axis of the imaginary cylinder may coincide with the axis of rotation of the electric motor.

The arrangement also has an engine nacelle in which the electric motor, the output stage modules, the collective intermediate circuit module, and the control logic module are arranged.

The disclosure also recites an aircraft having a modular arrangement as disclosed herein, wherein at least one electrically driven engine which is supplied by the arrangement is formed.

BRIEF DESCRIPTION OF THE DRAWINGS

Further special features and advantages of the disclosure become clear from the following explanations of a plurality of exemplary embodiments on the basis of schematic drawings.

In the drawings.

DETAILED DESCRIPTION

According to the disclosure, the output stage pairing of the intermediate circuit power semiconductors of the converter is divided into a plurality of individual elements. Each individual element corresponds to a commutation cell for a motor phase. In this case, the commutation cell may be in the form of a half-bridge circuit (FIG. 3) or an H-bridge circuit (FIG. 4). A collective intermediate circuit then connects the individual commutation cells to form an overall intermediate circuit from the point of view of the high-voltage source. A central control component (e.g., central control unit) controls the commutation cells.

The individual capacitances (e.g., first capacitors) of the commutation cells are kept small in order to save weight and volume. The function of the individual capacitances involves implementing a weakly inductive commutation cell of the respective phase. There are no ripple voltage requirements inside the converter which would result in an increase in the individual capacitances. The collective capacitance (e.g., second capacitor) buffers the individual phase ripples and is used as a high-voltage bus which implements a connection with a predefinable maximum ripple with respect to +DC and −DC. The overall capacitance including the parallel circuits of the second capacitor and the first capacitors is intended to be similar to an overall capacitance of conventional converters.

Figure 1:
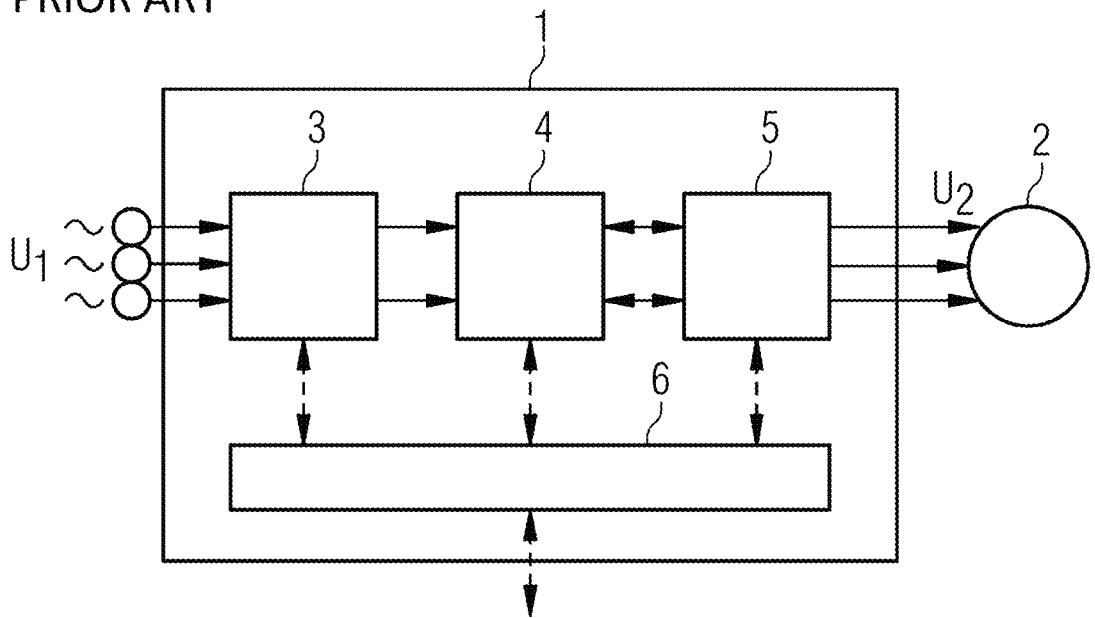
FIG. 1 shows a block diagram of an AC/DC-DC/AC converter according to the prior art.
Figure 2:
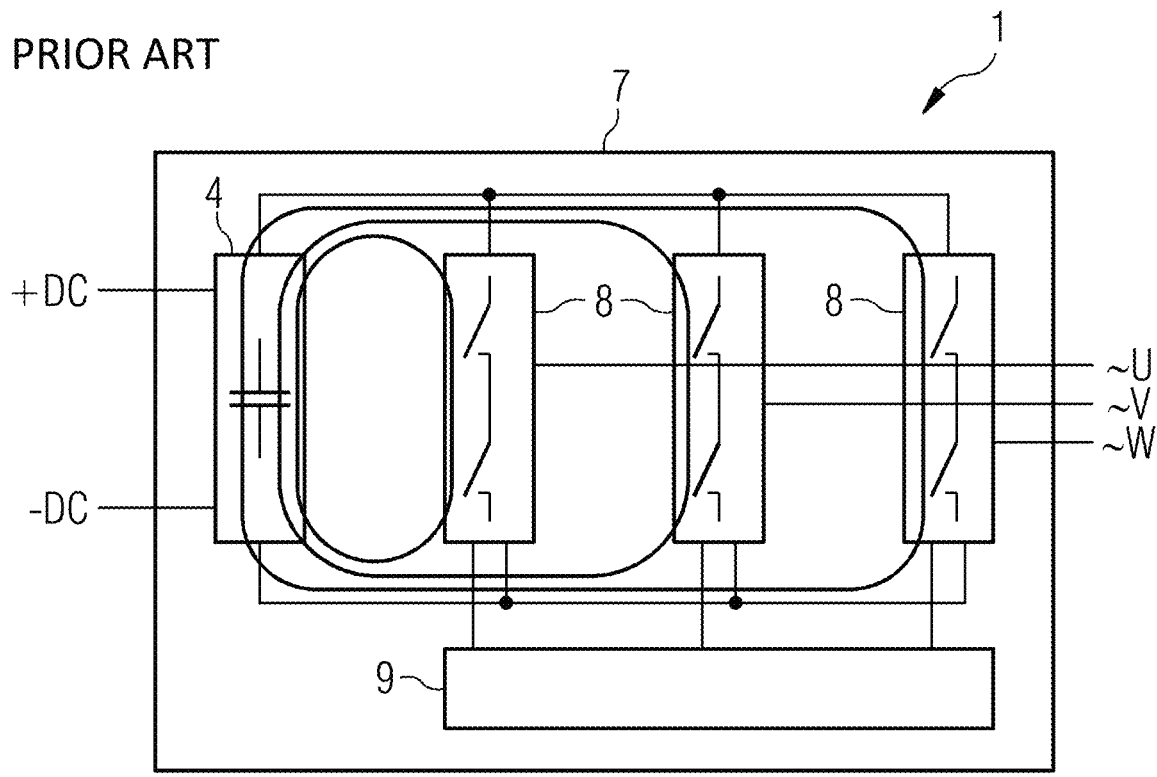
FIG. 2 shows a block diagram of a DC/AC converter according to the prior art.
Figure 3:
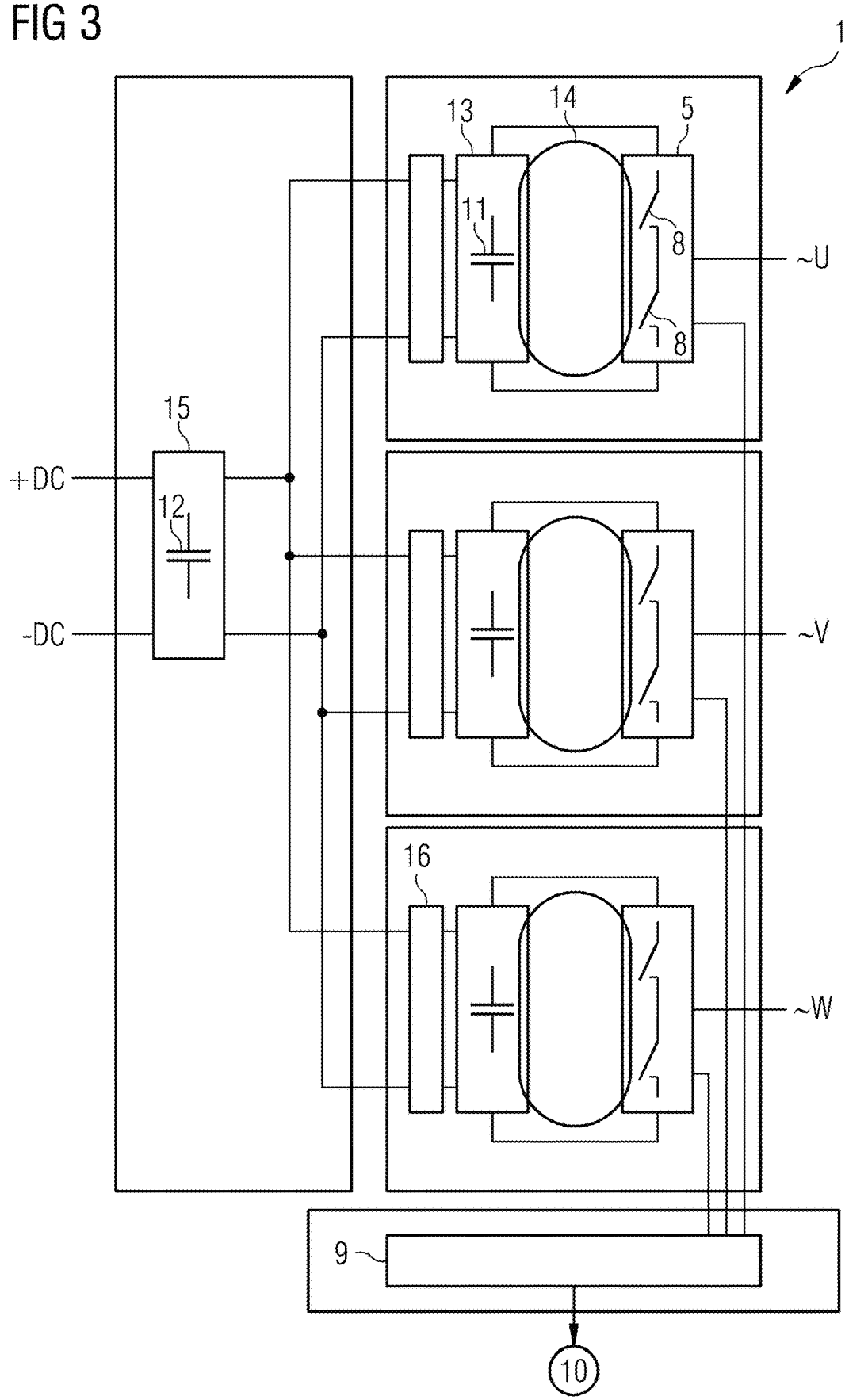
FIG. 3 shows a block diagram of an example of a DC/AC converter having phase intermediate circuits and having a collective intermediate circuit.
Figure 4:
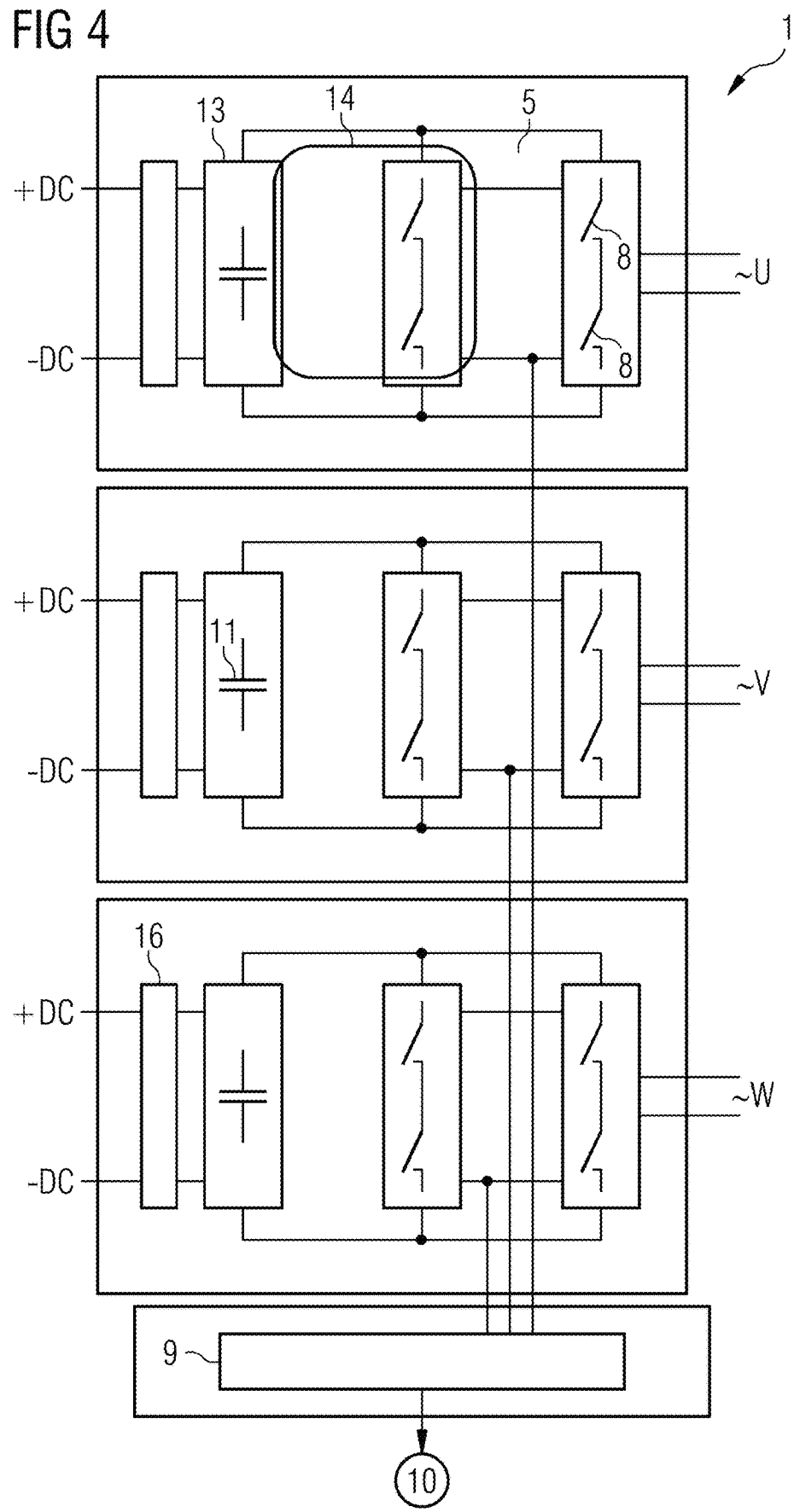
FIG. 4 shows a block diagram of an example of a DC/AC converter having phase intermediate circuits.

FIG. 3 shows a block diagram of a converter 1 which is electrically supplied with the DC voltage +DC, −DC, for example from a rechargeable battery. A collective intermediate circuit 15 having one or more second capacitors 12 distributes the DC voltage +DC, −DC to the commutation cells 14 of the three phases. Each commutation cell 14 has a phase intermediate circuit 13 and an inverter circuit 5 connected thereto. The phase intermediate circuit 13 has at least one first capacitor 11. The inverter circuit 5 has the power semiconductor switches 8 in the form of a half-bridge for forming the AC voltages ~U, ~V, and ~W.

The three phases of an electric motor may be supplied with the AC voltages ~U, ~V, and ~W. The inverter circuits 5 are supplied with the aid of a control logic circuit 9 which switches, inter alia, the power semiconductor switches 8 on and off. The control logic circuit 9 is connected to a central control unit 10 which is not illustrated.

Fuse circuits 16 which, in the event of a fault inside such a phase to be separated, may suddenly disconnect a phase from the DC supply +DC, −DC may be respectively connected upstream of the phase intermediate circuits 13.

FIG. 4 shows a block diagram of a converter 1 which is electrically supplied with the DC voltage +DC, −DC, (for example, from a rechargeable battery). The DC voltage +DC, −DC is distributed (e.g., without a collective intermediate circuit) to the commutation cells 14 of the three phases. Each commutation cell 14 has a phase intermediate circuit 13 and an inverter circuit 5 connected thereto. The phase intermediate circuit 13 has at least one first capacitor 11. The inverter circuit 5 has the power semiconductor switches 8 in the form of an H-bridge for forming the AC voltages ~U, ~V, and ~W.

The three phases of an electric motor may be supplied with the AC voltages ~U, ~V, and ~W. The inverter circuits 5 are supplied with the aid of a control logic circuit 9 which switches, inter alia, the power semiconductor switches 8 on and off. The control logic circuit 9 is connected to a central control unit 10 which is not illustrated.

Fuse circuits 16 which, in the event of a fault inside such a phase to be separated, may suddenly disconnect a phase from the DC supply +DC, −DC may be respectively connected upstream of the phase intermediate circuits 13.

FIG. 5 to FIG. 15 show illustrations of individual components of a modular converter 1, wherein the individual components are arranged on the end side of an electric motor 2 in a circular manner around a virtually extended axis of rotation of the electric motor 2. Such an arrangement may be used for installation in engine nacelles in aircraft.

Figure 5:
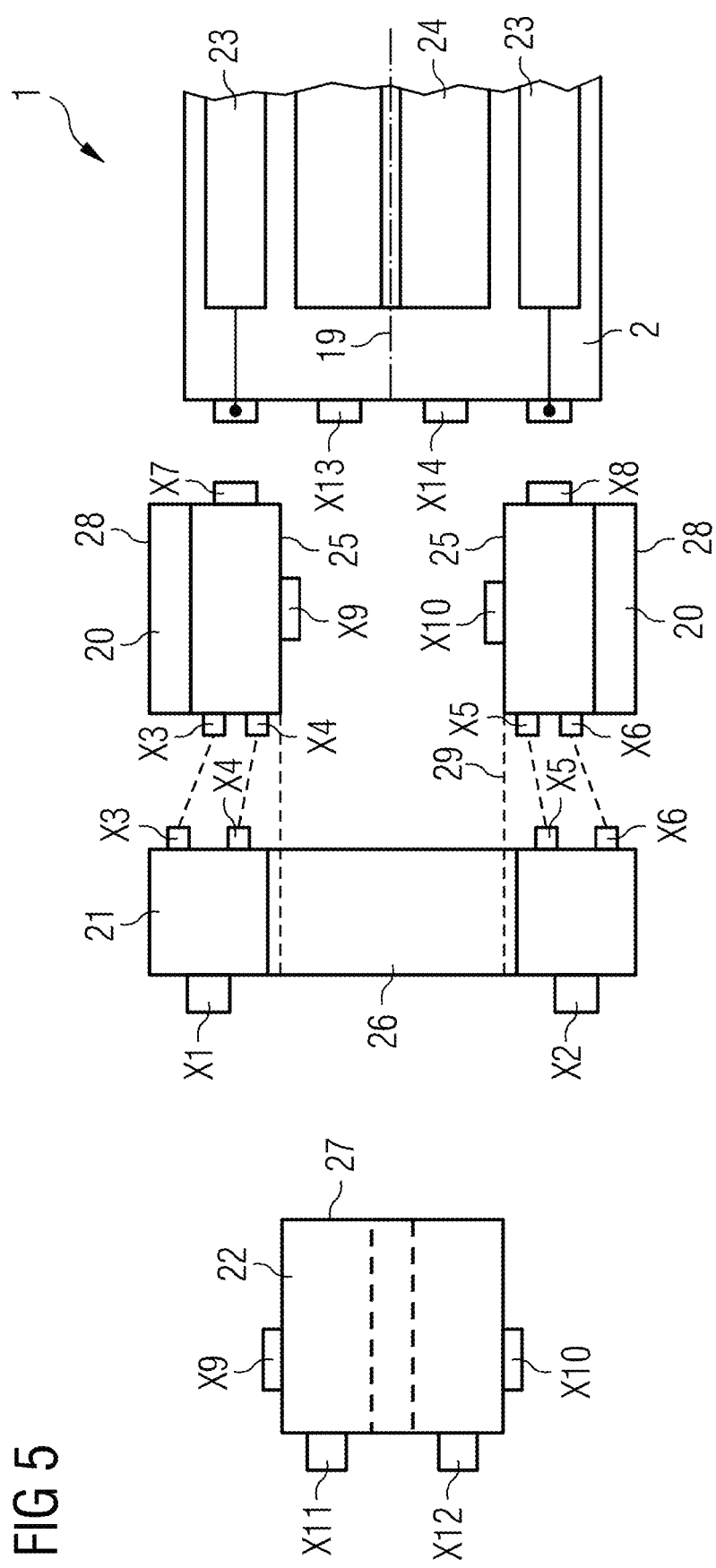
FIG. 5 shows an exploded side view of an example of a modular arrangement of a converter.

FIG. 5 shows an exploded view of the converter 1 which supplies a three-phase electric motor 2 with electrical energy. Two of the three phases may be seen. The electric motor 2 has an external stator 23 and an internal rotor 24. A cooling medium may enter the electric motor 2 through the connection X13 (e.g., forward flow). The heated cooling medium may leave the electric motor 2 through the connection X14 (e.g., return flow).

The output stage modules 20 are arranged in a manner uniformly distributed on the lateral surface of an imaginary cylinder 29, wherein the end sides of the output stage modules 20 are in one plane. The diameter of the imaginary cylinder 29 is selected in such a manner that the output stage modules 20 may be easily connected to the end side of the electric motor 2. The output stage modules 20 have a first casing 25 which is hermetically sealed to the outside and on the outside of which cooling units 28 (e.g., with cooling ribs) are arranged.

The output stage modules 20 each have a phase intermediate circuit 13, as described in FIG. 3 and FIG. 4 but not visible in FIG. 5, and an inverter circuit 5 (which is not visible), which together form a commutation cell 14. The output stage modules 20 are supplied with positive voltage from the collective intermediate circuit module 21 via the connectors X3 and X6 and are supplied with negative voltage from the collective intermediate circuit module 21 via the connectors X4 and X5. The output stage modules 20 are connected to a control logic module 22 via the connectors X9 and X10.

The collective intermediate circuit module 21 has a hermetically sealed second casing 26. The collective intermediate circuit module 21 is annular, wherein its internal diameter corresponds approximately to the diameter of the imaginary cylinder 29. The external diameter is configured to the size of the output stage modules 20. The collective intermediate circuit module 21 is supplied with positive voltage +DC from a DC voltage source, for example a rechargeable battery, via the connector X1 and is supplied with negative voltage −DC from a DC voltage source, for example a rechargeable battery, via the connector X2.

The control logic module 22 is cylindrical and has the connectors X9 and X10 for connection to the output stage modules 20. The connections may be electrical, optical, or opto-electrical. A connection to a central control unit 10, which is not illustrated, is established using the connector X11. This connection is redundantly established using the connector X12. The control logic module 22 has a hermetically sealed third casing 27.

Figure 6:
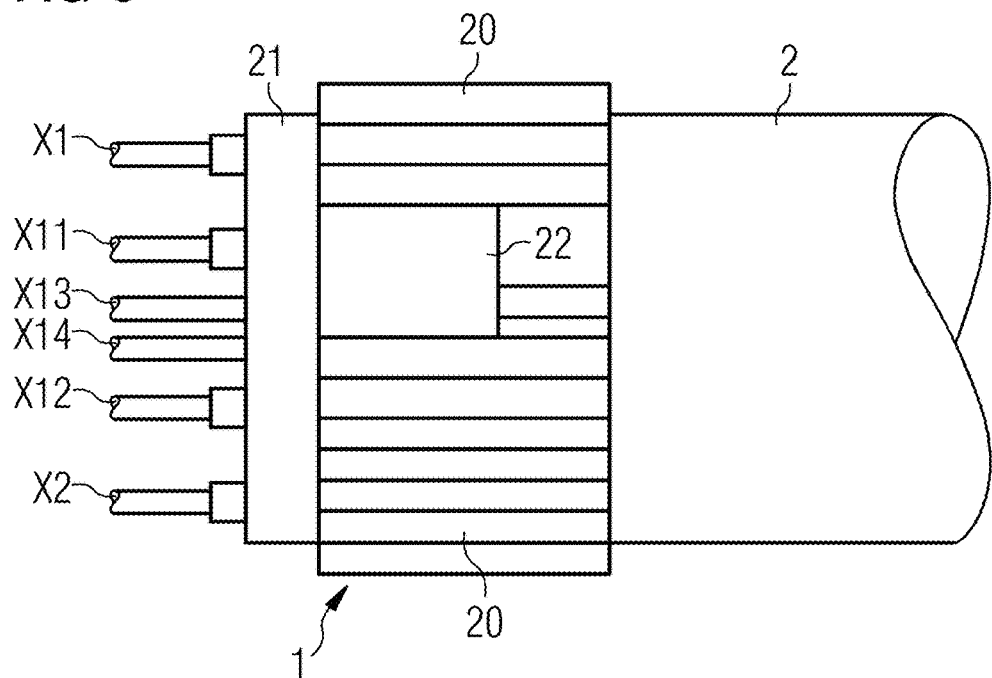
FIG. 6 shows a side view of an example of a modular arrangement of a converter.

FIG. 6 shows the arrangement from FIG. 5 in an assembled state. The converter 1 with the output stage modules 20, the collective intermediate circuit module 21, and the control logic module 22 may be seen. The modular converter 1 is on the end side of a multiphase electric motor 2. Both the modular converter 1 and the multiphase electric motor 2 may fit into a cylindrical engine nacelle 30, which is not illustrated. The connectors X1, X2, X11, and X12 and the connections X13 and X14 for the cooling system of the electric motor 2 may also be seen.

Figure 7:
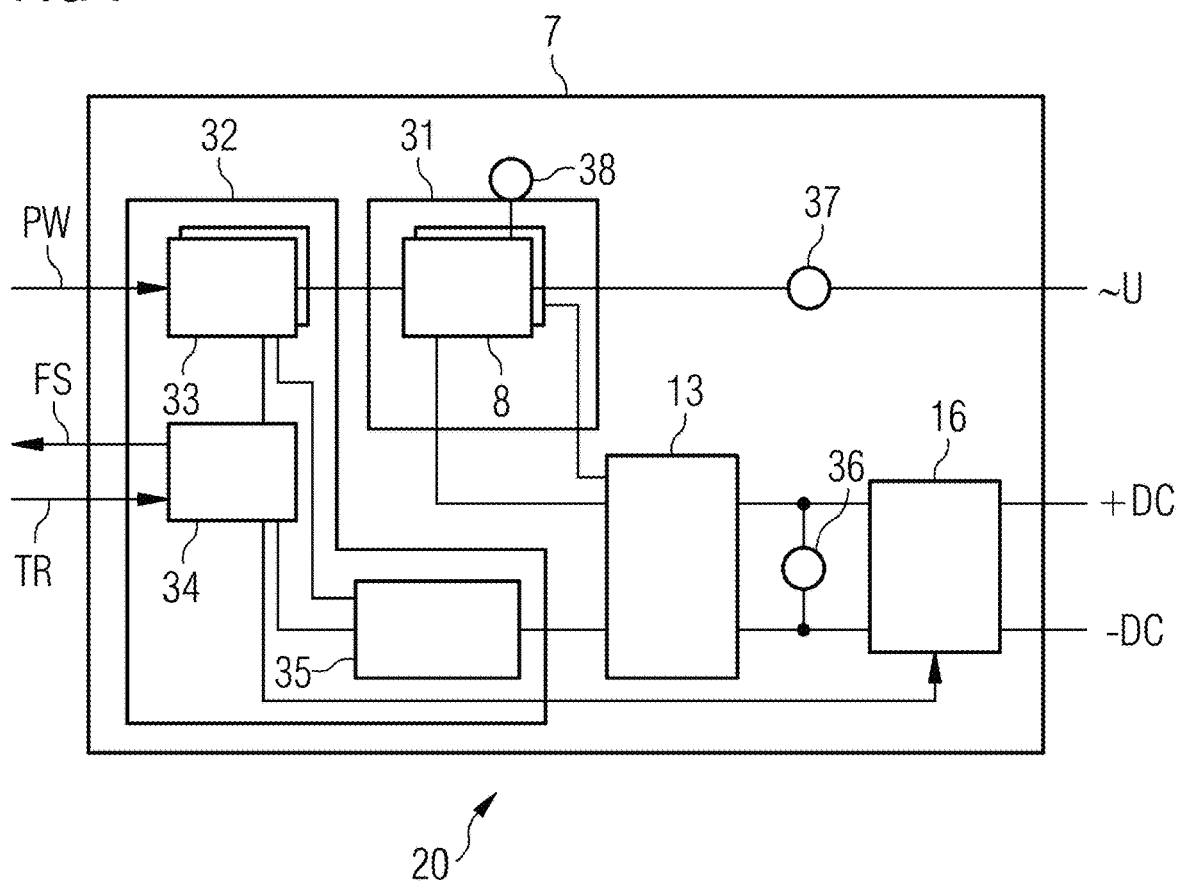
FIG. 7 shows a block diagram of an example of an output stage module of a modular arrangement of a converter.
Figure 8:
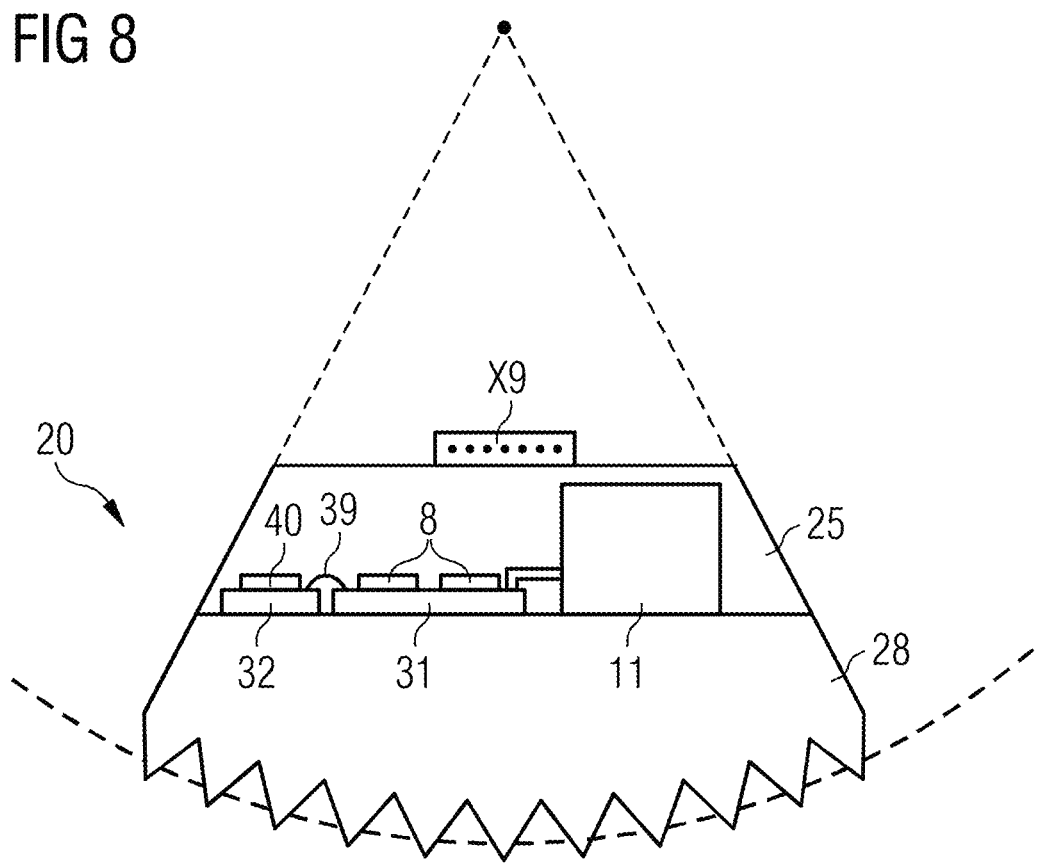
FIG. 8 shows a sectional view of an example of an output stage module of a modular arrangement of a converter.
Figure 9:
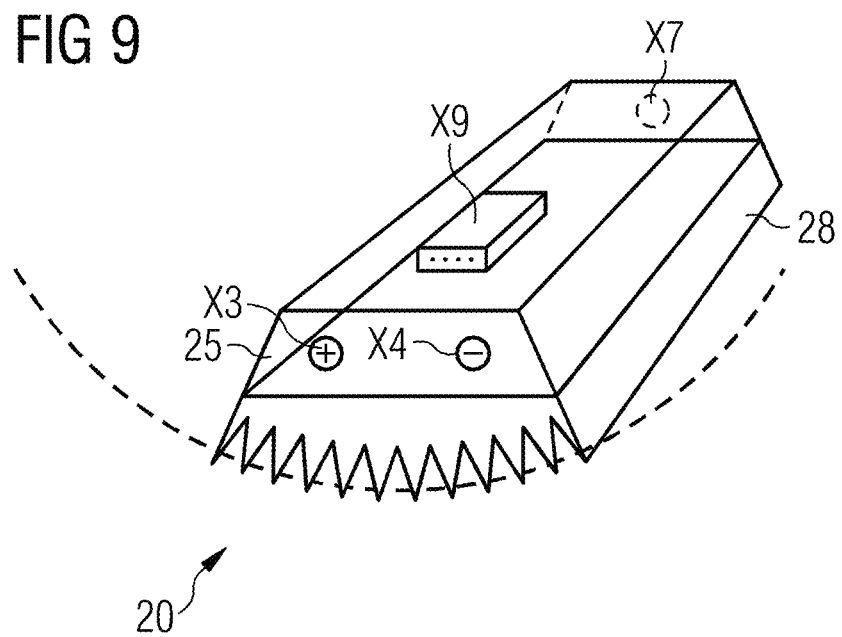
FIG. 9 shows an oblique view of an example of an output stage module of a modular arrangement of a converter.

FIG. 7 to FIG. 9 show an output stage module 20 of a modular arrangement of a converter 1 in an embodiment. FIG. 7 shows a block diagram of the output stage module 20, FIG. 8 shows a sectional view and FIG. 9 shows an oblique view. This is a fault-tolerant architecture which is suitable, in particular, for air-cooled nacelle drives. In this example, the respective output stage module 20 itself is not the subject of fault tolerance. The fault tolerance relates to the entire drive or to the overall drive system of a vehicle in the case of a plurality of distributed suitable individual drives.

FIG. 7 shows the block diagram of the output stage module 20 supplied with DC voltage using +DC and −DC. If necessary, (for example, in the event of a fault), the voltage supply may be suddenly interrupted by the fuse circuit 16 (for example, an explosive fuse). The voltage is determined using the voltmeter 36. The power semiconductor switches 8 are supplied with DC voltage via the phase intermediate circuit 13.

The power semiconductors 8 are on a first ceramic substrate 31 (for example, CERAMIC MODULE=Direct Copper Bonded). An autonomous self-starting power supply unit 35, drivers 33 for controlling the power semiconductor switches 8 as well as logic, and a transformer 34 are on a second ceramic substrate 32. The power semiconductor switches 8 output a single-phase AC voltage ~U. The modulated phase current is measured using the ammeter 37. The power semiconductor switches 8 are monitored by the calibration and measuring circuit 38.

The pulse-width-modulated signals for controlling the power semiconductor switches 8 enter the output stage module 20 via the input PW. The fuse circuit 16 is triggered via the input TR. The logic and the transformer 34 output measurement and fault signals via the output FS.

All important components are directly connected to the cooling unit 28, which is not illustrated, via the first and second ceramic modules 31, 32. All logic circuits may therefore be applied to ceramic modules. It is advantageous to use ASICs for this purpose in order to minimize the number of logic components and consequently also the solder points. There may be one or two ceramic modules.

Two ceramic modules are illustrated, wherein the logic 34 and power semiconductor switches 8 are arranged on ceramic modules which are separated from one another. A single ceramic module may be advantageous because connections (for example, bonds) between the ceramic modules are therefore avoided. Measuring sensors may be accommodated on both ceramic modules, depending on the need for the arrangement and advantageous spatial vicinity to a measuring location. It is advantageous to accommodate the measuring sensors on the second ceramic module 32 in the logic 34. In the case of separate DCBs, diversified manufacturing processes may be implemented, (for example, sintering of the first ceramic module 31 and soldering of the second ceramic module 32).

The resulting interior of the output stage module 20 is geometrically minimized. The minimized interior is hermetically sealed and is completely filled with oil or another insulating medium. As a result, there is no need for any silicone potting compounds. Alternatively, air may also be used as the filling medium. However, a pressure equalization valve and a silicone compound are then required. Alternatively, further circuits may be present, in particular, the calibration and measuring circuit 38 for carrying out the Vce-T method for determining the depletion layer temperature of the power semiconductor switches 8 in order to be able to derive their service life consumption therefrom.

FIG. 8 shows a sectional view through an output stage module 20 having a circuit arrangement according to FIG. 7. The first casing 25 having a cooling unit 28 sitting on the latter is illustrated. The two ceramic modules 31 and 32 and the first capacitor 11 are inside the first casing 25. The power semiconductor switches 8 are on the first ceramic module 31 and an ASIC 40 is on the second ceramic module 32. The two ceramic modules 31 and 32 are connected using a connection 39 (for example, a bond). The connection to the control logic module 22, which is not illustrated, is established using the connector X9. The outer shape of the output stage module 20 is in the form of a partial ring segment.

FIG. 9 shows a spatial view of the output stage module 20 according to FIG. 8. The output stage module 20 has a first casing 25 having the connectors X3, X4, X7, and X9. A cooling unit 29 having cooling ribs sits on the casing 26. An output stage module 20 is formed for each phase, wherein the output stage modules 20 are spatially separated from one another. In certain examples, the output stage modules 20 are identical.

Figure 10:
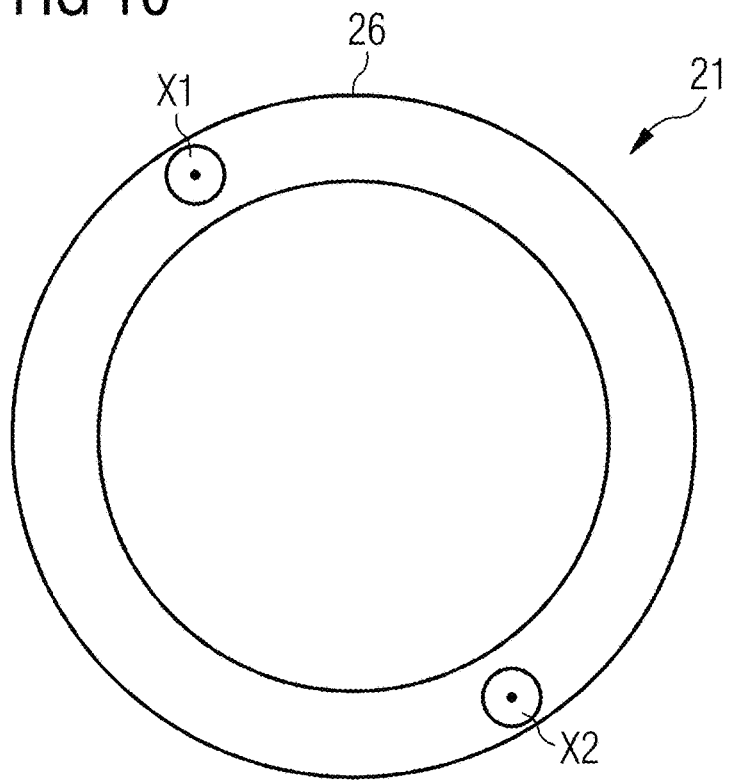
FIG. 10 shows a front view of an intermediate circuit module of a modular arrangement of a converter.
Figure 11:
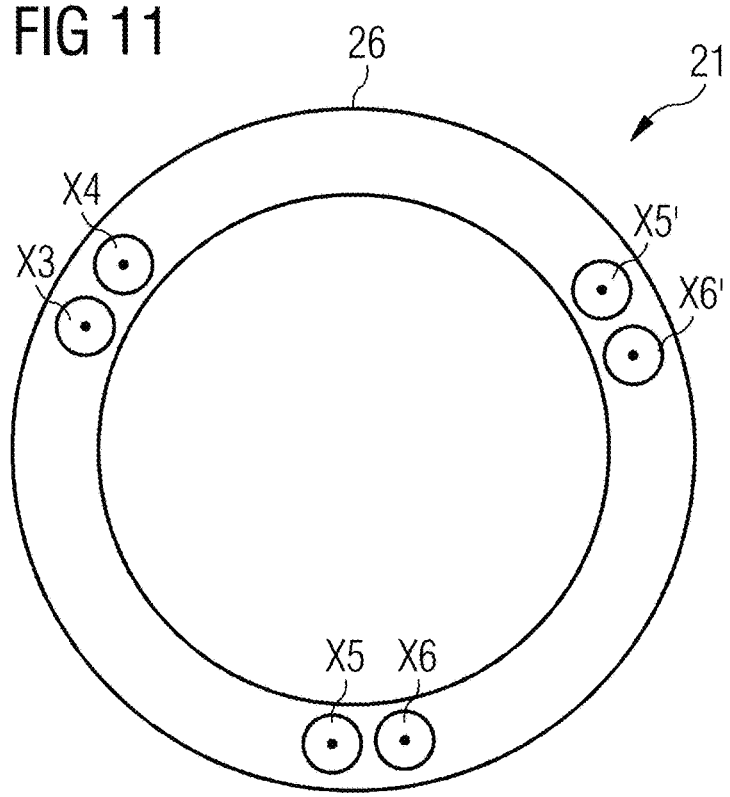
FIG. 11 shows a rear view of an example of an intermediate circuit module of a modular arrangement of a converter.
Figure 12:
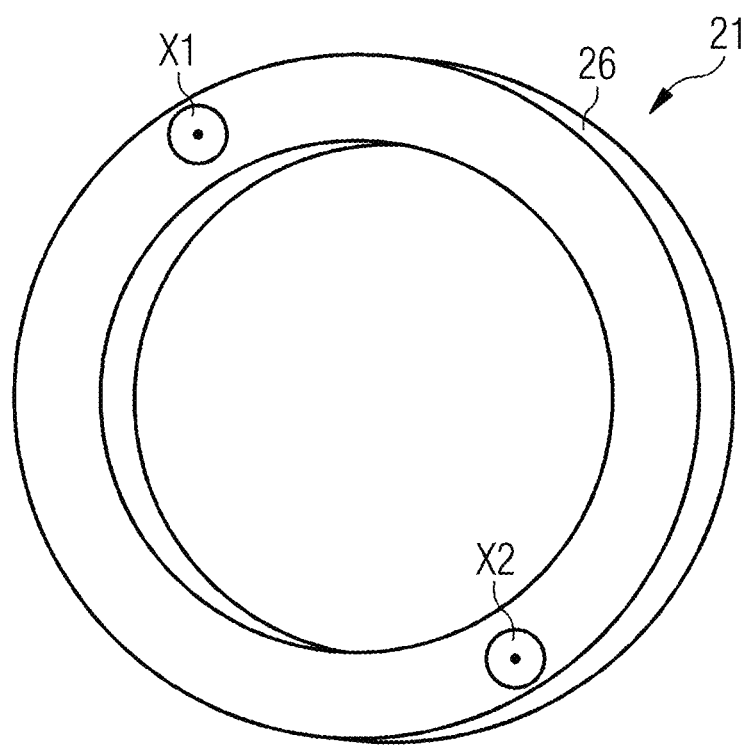
FIG. 12 shows an oblique view of an example of an intermediate circuit module of a modular arrangement of a converter.

FIG. 10 to FIG. 12 show views of an intermediate circuit module 21 of a modular arrangement of a converter 1. FIG. 10 shows a front view, FIG. 11 shows a rear view, and FIG. 12 shows a spatial view. In all three illustrations, the second casing 26 of the collective intermediate circuit module 21 may be seen. The connectors X1 and X2, which establish the connection to the DC voltage supply +DC and −DC, may be seen in FIG. 10 and FIG. 12. The output stage module 20 is supplied with DC voltage from the collective intermediate circuit module 21 with the aid of the connectors X3, X4, X5, X6, X5', and X6'. Two connectors are responsible for one phase in each case.

The collective intermediate circuit module 21 is circular such that it may be connected to the output stage modules 20. The internal diameter of the collective intermediate circuit module 21 is approximately equal to the diameter of the imaginary cylinder 29 (FIG. 5). The external diameter of the collective intermediate circuit module 21 is selected in such a manner that the arrangement fits into a nacelle.

The second capacitor 12 of the collective intermediate circuit module 21 is advantageously likewise annular. The capacitance of the second capacitor 12 is only a partial capacitance of the total capacitance, as described further above.

It is advantageous, for aeronautical applications in which nacelle-enabled drive solutions are relevant, for the external ring diameter of the collective intermediate circuit module 21 to correspond approximately to that of the motor external diameter and for the internal ring diameter to correspond approximately to that of the rotor diameter. For air cooling systems, cooling ribs are formed on the outer radius and may improve cooling with appropriate contact with the internal core of the second capacitor 12.

Figure 13:
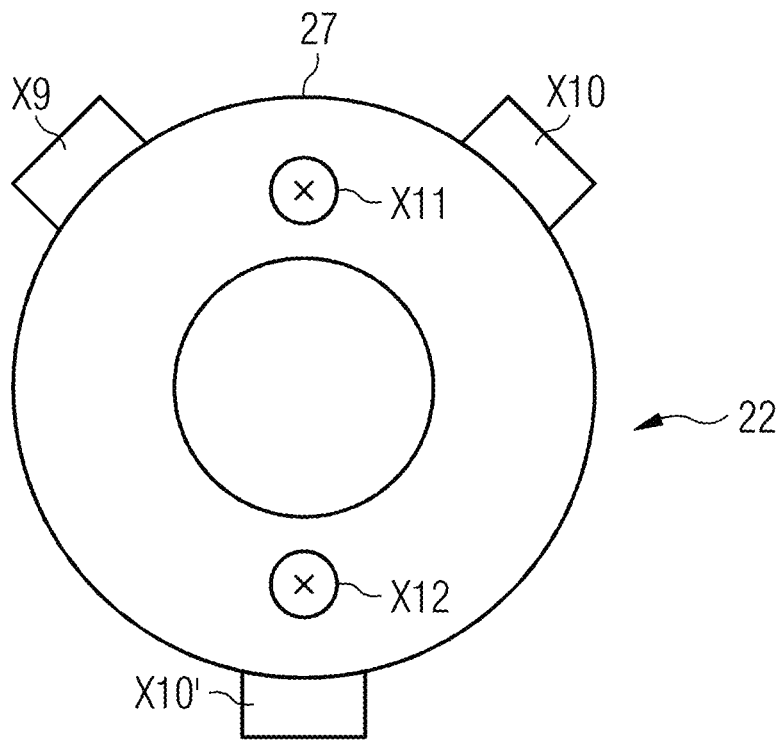
FIG. 13 shows a front view of an example of a control logic module of a modular arrangement of a converter.
Figure 14:
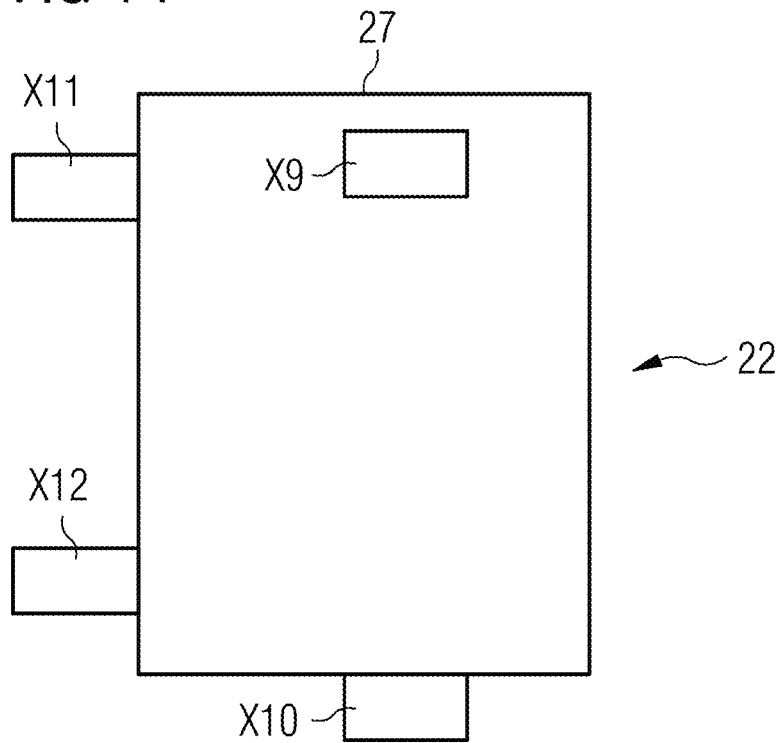
FIG. 14 shows a side view of an example of a control logic module of a modular arrangement of a converter.
Figure 15:
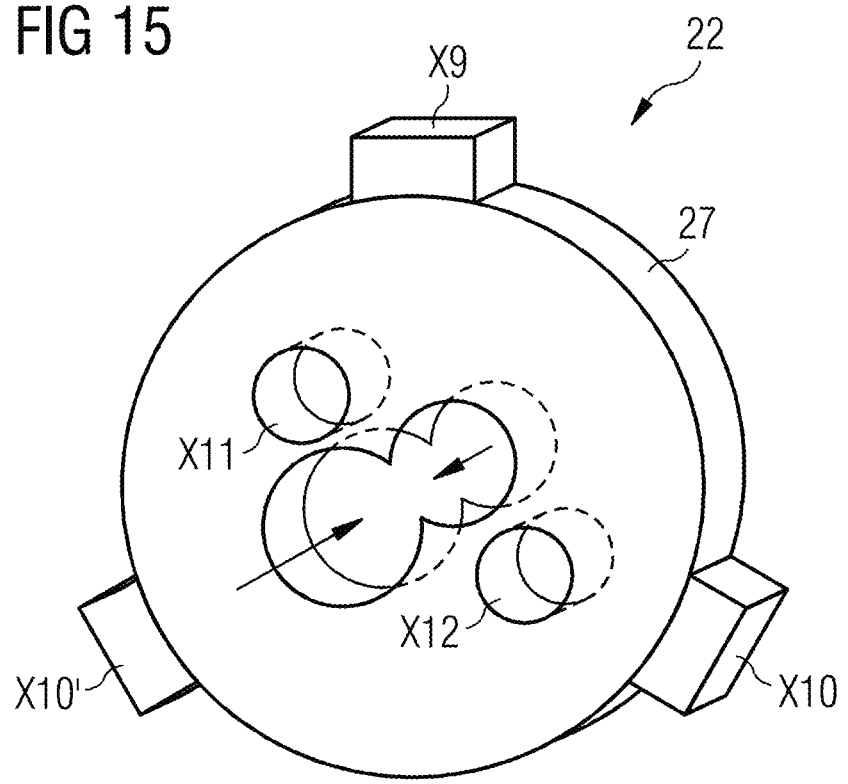
FIG. 15 shows an oblique view of an example of a control logic module of a modular arrangement of a converter.

FIG. 13 to FIG. 15 show views of a control logic module 22 of a modular arrangement of a converter 1. FIG. 13 shows a front view, FIG. 14 shows a side view, and FIG. 15 shows a spatial view. The control logic module 22 has a casing 27 and the connectors X11 and X12 for redundant connection to a central control unit. The connection to the output stage modules 20 is established using the connectors X9, X10, and X10'.

The control logic module 22 is cylindrical and fits into the output stage modules 20 arranged in the form of a circle through the collective intermediate circuit module 21. The control logic module 22 has a cutout in the longitudinal direction, through which cooling hoses may be guided to the electric motor 2.

This is an advantageous embodiment for the plug-and-play structure of a modular converter 1. The control logic is completely thermally decoupled from the power semiconductors. A more favorable electrical design may therefore be achieved. Furthermore, it is spatially protected from the output stage modules 20 in the event of a fault. The assembly is operated solely with low voltage. There is no need for a separation point. This enables very short air and creepage paths because they are completely implemented in the output stage modules 20 in accordance with the concept. Consequently, a minimal design is possible. In the event of maintenance, the control logic module, the output stage modules 20 and the collective intermediate circuit module 21 may be selectively exchanged.

Figure 16:
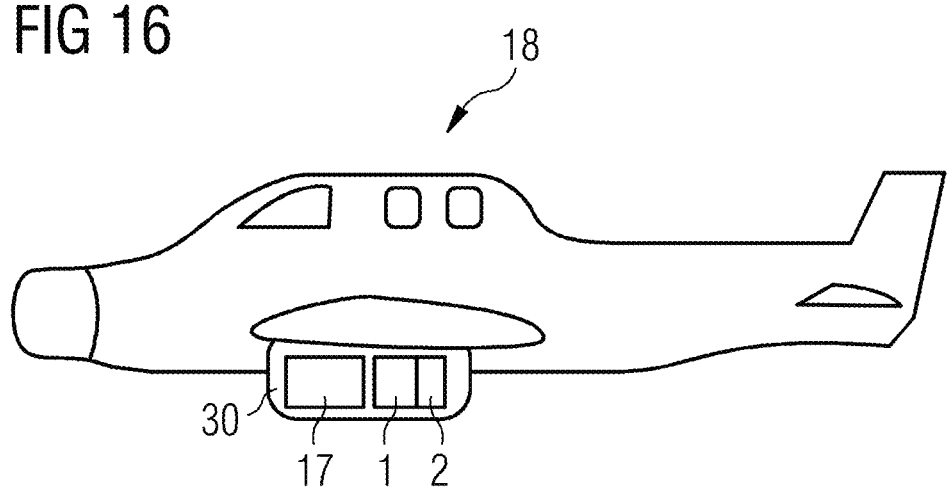
FIG. 16 shows a block diagram of an example of an electrically driven aircraft.

FIG. 16 shows a block diagram of an aircraft 18, for example an airplane, having a converter arrangement according to FIG. 3 to FIG. 15, wherein the circuit arrangement of the converter 1 supplies an electrically driven engine 17 with electrical energy. The engine 17 is advantageously accommodated in an engine nacelle 30. The converter 1 and the electric motor 2 are also in the engine nacelle 30.

Although the disclosure has been described and illustrated more specifically in detail by the exemplary embodiments, the disclosure is not restricted by the disclosed examples and other variations may be derived therefrom by a person skilled in the art without departing from the scope of protection of the disclosure.

LIST OF REFERENCE SIGNS

1 Converter
2 Electric motor
3 Rectifier circuit
4 Intermediate circuit
5 Inverter circuit
6 Control circuit unit
7 Casing
8 Power semiconductor switch
9 Control logic circuit
10 Central control unit
11 First capacitor
12 Second capacitor
13 Phase intermediate circuit
14 Commutation cell
15 Collective intermediate circuit
16 Fuse circuit
17 Engine
18 Aircraft
19 Axis of rotation of the electric motor 2
20 Output stage module
21 Collective intermediate circuit module
22 Control logic module
23 Stator
24 Rotor
25 First casing
26 Second casing
27 Third casing
28 Cooling unit
29 Imaginary cylinder
30 Engine nacelle
31 First ceramic module
32 Second ceramic module
33 Driver circuit 34 Logic and transformer
35 Power supply unit
36 Voltmeter
37 Ammeter
38 Calibration and measuring circuit
39 Connection
40 ASIC
+DC Positive input DC voltage
−DC Negative input DC voltage
FS Fault signal
PW PWM signal
TR Trigger for fuse circuit
$U_1$ Input voltage
$U_2$ Output voltage
~U Output-side AC voltage of first phase
~V Output-side AC voltage of second phase
~W Output-side AC voltage of third phase
X1 Connector for +DC
X2 Connector for −DC
X3 Connector for the positive voltage supply of an output stage module 20
X4 Connector for the negative voltage supply of an output stage module 20
X5 Connector for the negative voltage supply of a further output stage module 20
X5' Connector for the negative voltage supply of a further output stage module 20
X6 Connector for the positive voltage supply of a further output stage module 20
X6' Connector for the positive voltage supply of a further output stage module 20
X7 Connector for a phase output to an electric motor 2
X8 Connector for a further phase output to an electric motor 2
X9 Connector for the connection to the control logic module 22 of a phase
X10 Connector for the connection to the control logic module 22 of a further phase
X10' Connector for the connection to the control logic module 22 of a further phase
X11 Connector of the control logic module 22 for connection to a central control unit 10
X12 Connector of the control logic module 22 for redundant connection to a central control unit 10
X13 Connection for the forward flow of cooling medium
X14 Connection for the return flow of cooling medium

The invention claimed is:

1. An arrangement of a converter for electrically supplying a multiphase electric motor, the arrangement comprising:
a plurality of output stage modules, wherein each module has a separate casing; and
a control logic module having a casing, wherein the control logic module is electrically, optically, or electro-optically connected to the plurality of output stage modules,
wherein the control logic module is cylindrical, and the plurality of output stage modules are arranged on an outer side of the control logic module,
wherein an output stage module of the plurality of output stage modules is present for each phase of the multiphase electric motor,
wherein each output stage module has a phase intermediate circuit and an inverter circuit which together form a commutation cell, and
wherein the phase intermediate circuits are configured to be supplied with DC voltage and are electrically connected to the inverter circuits, and
wherein the control logic module is configured and programmed to control the inverter circuits.

2. The arrangement of claim 1, wherein each output stage module of the output stage modules is arranged on a lateral surface of an imaginary cylinder.

3. The arrangement of claim 2, wherein end faces of the plurality of output stage modules are in a common plane and are uniformly distributed on the lateral surface.

4. The arrangement of claim 1, where each output stage module of the plurality of output stage modules has a cooling unit on an outer side of a respective casing of the output stage module.

5. The arrangement of claim 1, further comprising:
a collective intermediate circuit module having a casing,
wherein the phase intermediate circuits of the plurality of output stage modules are electrically connected in parallel to the collective intermediate circuit module.

6. The arrangement of claim 5, wherein the collective intermediate circuit module is annular.

7. The arrangement of claim 6, wherein each output stage module of the plurality of output stage modules is arranged on a lateral surface of an imaginary cylinder, and
wherein an internal diameter of the annular collective intermediate circuit module is equal to a diameter of the imaginary cylinder.

8. The arrangement of claim 1, wherein the control logic module has a cutout in an axial direction, through which a forward flow and a return flow of a cooling system of an electric motor are configured to be guided.

9. The arrangement of claim 1, further comprising:
a collective intermediate circuit module having a casing,
wherein the phase intermediate circuits of the plurality of output stage modules are electrically connected in parallel to the collective intermediate circuit module; and
cylindrical electric motor,
wherein the plurality of output stage modules and the control logic module are arranged on an end side of the cylindrical electric motor, and
wherein the collective intermediate circuit module is arranged on sides of the plurality of output stage modules remote from the cylindrical electric motor.

10. The arrangement of claim 9, wherein each output stage module of the plurality of output stage modules is arranged on a lateral surface of an imaginary cylinder, and
wherein a cylinder axis of the imaginary cylinder coincides with an axis of rotation of the cylindrical electric motor.

11. The arrangement of claim 10, further comprising:
an engine nacelle,
wherein the cylindrical electric motor, the plurality of output stage modules, the collective intermediate circuit module, and the control logic module are arranged in the engine nacelle.

12. An aircraft comprising:
an arrangement of a converter for electrically supplying a multiphase electric motor; and
at least one electrically driven engine supplied by the arrangement,
wherein the arrangement comprises:
a plurality of output stage modules, wherein each module has a separate casing;

a control logic module having a casing, wherein the control logic module is electrically, optically, or electro-optically connected to the plurality of output stage modules;

a collective intermediate circuit module having a casing; and a cylindrical electric motor, wherein the control logic module is cylindrical, and the plurality of output stage modules are arranged on an outer side of the control logic module, wherein an output stage module of the plurality of output stage modules is present for each phase of the multiphase electric motor, wherein each output stage module has a phase intermediate circuit and an inverter circuit which together form a commutation cell, and wherein the phase intermediate circuits are configured to be supplied with DC voltage and are electrically connected to the inverter circuits, and wherein the control logic module is configured and programmed to control the inverter circuits, wherein the phase intermediate circuits of the plurality of output stage modules are electrically connected in parallel to the collective intermediate circuit module; and wherein the plurality of output stage modules and the control logic module are arranged on an end side of the cylindrical electric motor, and wherein the collective intermediate circuit module is arranged on sides of the plurality of output stage modules remote from the cylindrical electric motor.

13. The aircraft of claim 12, wherein each output stage module of the plurality of output stage modules is arranged on a lateral surface of an imaginary cylinder, and wherein a cylinder axis of the imaginary cylinder coincides with an axis of rotation of the cylindrical electric motor.

14. The aircraft of claim 13, wherein the arrangement of the aircraft further comprises an engine nacelle, and wherein the cylindrical electric motor, the plurality of output stage modules, the collective intermediate circuit module, and the control logic module are arranged in the engine nacelle.

* * * * *